(12) United States Patent
Guha (10) Patent No.: US 8,608,973 B1
(45) Date of Patent: Dec. 17, 2013

(54) LAYER-LAYER ETCH OF NON VOLATILE MATERIALS USING PLASMA

(75) Inventor: Joydeep Guha, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 35 days.

(21) Appl. No.: 13/486,765

(22) Filed: Jun. 1, 2012

(51) Int. Cl.
*B44C 1/22* (2006.01)
*C03C 15/00* (2006.01)
*C03C 25/68* (2006.01)
*C23F 1/00* (2006.01)

(52) U.S. Cl.
USPC .............................................. 216/67; 438/710

(58) Field of Classification Search
USPC .............................................. 216/67; 438/710
See application file for complete search history.

(56) References Cited

U.S. PATENT DOCUMENTS

| 8,124,541 B2 | 2/2012 | Marsh | |
| 2007/0193973 A1* | 8/2007 | Kim et al. | 216/41 |
| 2010/0075491 A1* | 3/2010 | Tosaka | 438/586 |

* cited by examiner

*Primary Examiner* — Roberts Culbert
(74) *Attorney, Agent, or Firm* — Beyer Law Group LLP (57) ABSTRACT

A method for etching a metal layer, comprising plurality of cycles is provided. In each cycle, an etch gas comprising $PF_3$, CO and NO, or $COF_2$ is flowed into a process chamber. In each cycle, the etch gas is formed into a plasma. In each cycle, the flow of the etch gas is stopped.

18 Claims, 9 Drawing Sheets

LAYER-LAYER ETCH OF NON VOLATILE MATERIALS USING PLASMA

BACKGROUND OF THE INVENTION

The present invention relates to etching a layer of non volatile materials through a mask during the production of a semiconductor device. More specifically, the present invention relates to etching a metal containing layer.

During semiconductor wafer processing, features may be etched through a metal containing layer. In the formation of magnetoresistive random-access memory (MRAM) or resistive random-access memory (RRAM) devices, a plurality of thin metal layers or films may be sequentially etched.

The etching of such MRAM layers is very challenging due to extremely low vapor pressure of the etch by products formed. Some MRAM etch processes are sputter dominated processes, which cause the loss of control of profile angle and sidewall polymer buildup. These results prevent scaling down feature size and reduce device reliability.

SUMMARY OF THE INVENTION

To achieve the foregoing and in accordance with the purpose of the present invention, a method for etching a metal layer comprising plurality of cycles is provided. In each cycle, an etch gas comprising $PF_3$, CO and NO, or $COF_2$ is flowed into a process chamber. In each cycle, the etch gas is formed into a plasma. In each cycle, the flow of the etch gas is stopped.

In another manifestation of the invention, a method for etching a metal layer comprising plurality of cycles is provided. An activation phase comprises flowing an activation gas comprising He, $H_2$, or Ar into a process chamber, forming the activation gas into a plasma, and stopping the flow of the activation gas into the process chamber. An etch phase comprises flowing an etch gas comprising $PF_3$ or CO and NO into the process chamber, wherein the etch gas is not transformed into a plasma, and stopping the flow of the etch gas into the process chamber.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Etch Phase and Clean Phase

Figure 1:
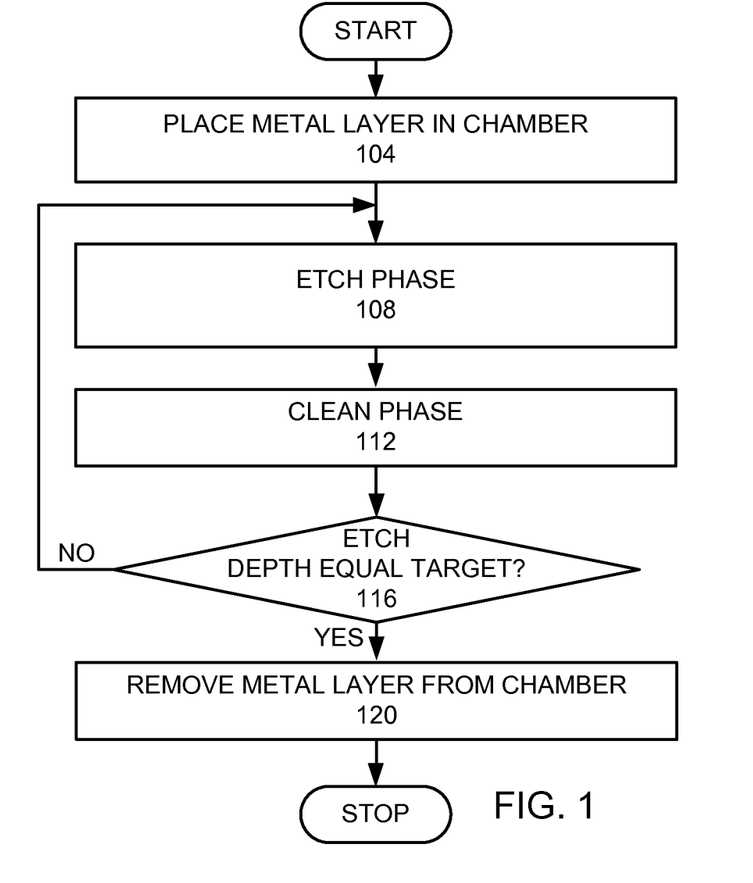
FIG. 1 is a high level flow chart of an embodiment of the invention.

To facilitate understanding, FIG. 1 is a high level flow chart of a process used in an embodiment of the invention. A substrate with a metal layer is placed in a chamber (step 104). An etch process is performed comprising a plurality of cycles, wherein each cycle comprises an etch phase (step 108) and a clean phase (step 112). A determination is made of whether the etch is complete or should continue, such as whether the etch depth is equal to a target etch depth (step 116). If the etch is not complete, then process goes back to step 108. If the etch is complete, then the substrate and remaining metal layer are removed from the chamber (step 120).

EXAMPLES

Figure 2A:
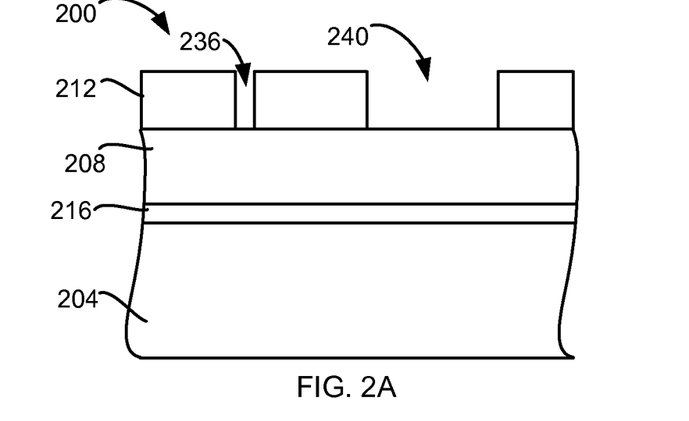
FIGS. 2A-C are schematic views of a stack processed according to an embodiment of the invention.

In an example of the invention, a substrate with a metal layer is placed in a plasma processing chamber (step 104). FIG. 2A is a cross-sectional view of a stack 200 with a substrate 204 over which a metal layer 208 has been formed. A patterned thermal hardmask layer 212 is placed over the metal layer 208. In this example, an intermediate layer 216 is placed between the substrate 204 and the metal layer 208. One or more layers may be placed between the substrate 204 and the metal layer 208. In addition, one or more layers may be placed between the patterned thermal hardmask layer 212 and the metal layer 208. In this example, the patterned thermal hardmask layer 212 has features 236, 240 with different aspect ratios. A patterned photoresist mask may be placed above the patterned thermal hardmask layer 212. In this example, the substrate 204 is a silicon wafer, and the metal layer 208 is iron (Fe). Additional metal layers may be used to form magnetoresistive random-access memory (MRAM) or a resistive random-access memory (RRAM) device. Such metal layers may be but are not limited to Co, Fe, Pd, Pt, Mn, Mg, Ru, Ta, Al, Cr, and Zr. The intermediate layer 216 may be one or more additional layers used to form MRAM or RRAM devices. The patterned thermal hardmask layer 212 may be a conventional hardmask material such as SiN or may be another material. In this embodiment, the patterned thermal hardmask layer 212 is resistant to ashing or melting at temperatures at which a precursor metal complex would vaporize. Because of this, the patterned thermal hardmask layer 212 would not be formed from a photoresist material, which melts at a temperature below 300° C.

Figure 3:
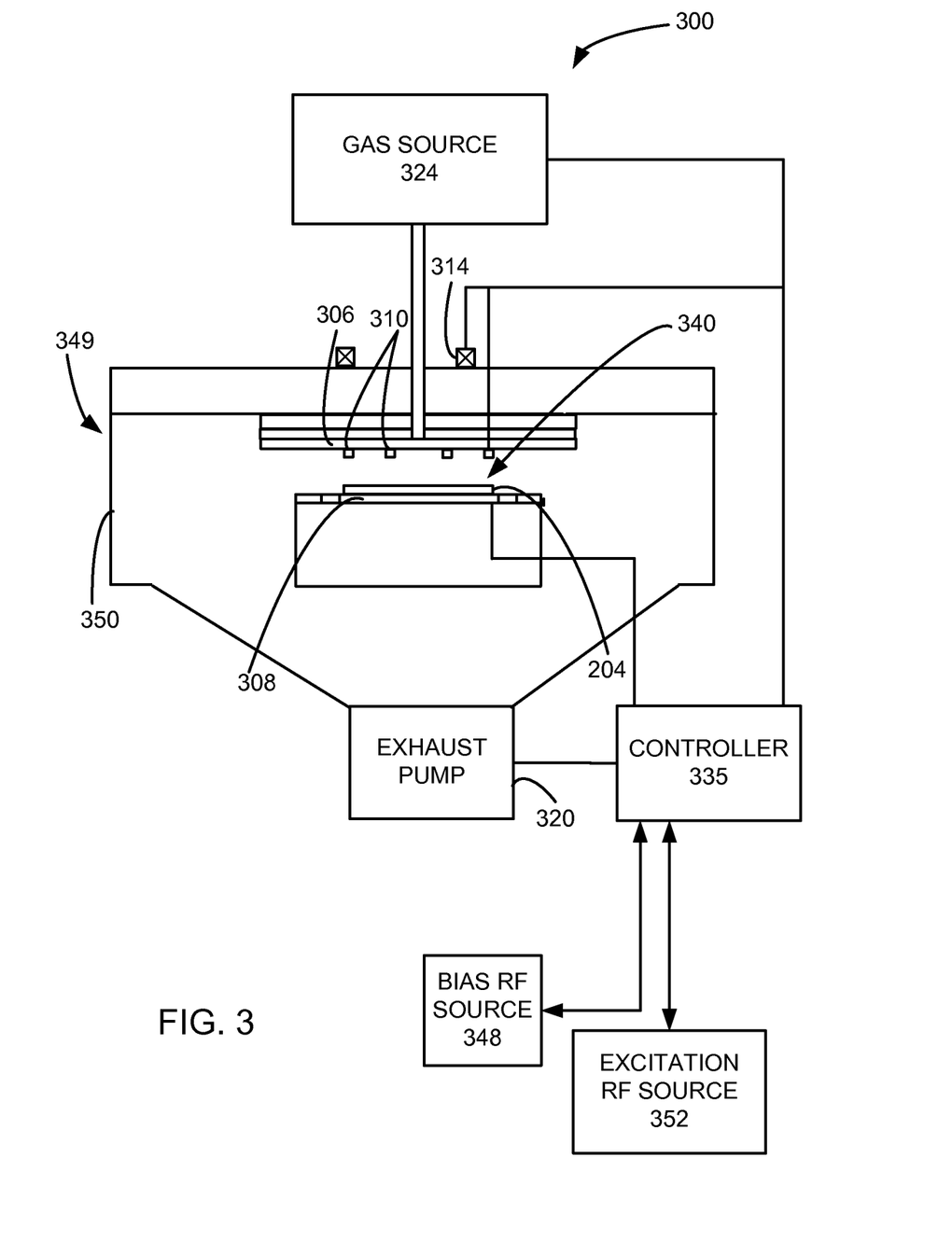
FIG. 3 is a schematic view of an etch reactor that may be used for etching.

FIG. 3 is a schematic view of an etch reactor that may be used in practicing the invention. In one or more embodiments of the invention, an etch reactor 300 comprises an antenna electrode 314, a gas distribution plate 306 providing a gas inlet, and an electrostatic chuck (ESC) 308, within an etch process chamber 349, enclosed by a chamber wall 350. Within the etch process chamber 349, the substrate 204 is positioned on top of the electrostatic chuck 308. The electrostatic chuck 308 provides a bias from the bias RF source 348 as an electrostatic chuck (ESC) for holding the substrate 204 or may use another chucking force to hold the substrate 204. A heat source 310, such as heat lamps, is provided to heat the metal layer. A gas source 324 is connected to the etch chamber 349 through the distribution plate 306.

A bias RF source 348 and an excitation RF source 352 are electrically connected to the etch process chamber 349 through a controller 335 to provide power to the antenna electrode 314 and the ESC 308. The bias RF source 348 generates bias RF power and supplies the bias RF power to the etch process chamber 349. In this example, the bias RF power has a frequency of 2 MHz. The excitation RF source 352 generates source RF power and supplies the source RF power to the etch process chamber 349. In this example, this source RF power has a frequency of 13.56 MHz.

The different RF signals may be supplied to various combinations of the top and bottom electrodes. Preferably, the lowest frequency of the RF should be applied through the ESC 308 on which the material being etched is placed. In this example, the excitation RF source 352 provides power to the antenna electrode 314.

The controller 335 is also connected to the gas source 324. The controller 335 controls the flow of the etch gas into the etch process chamber 349, the chamber pressure, as well as the generation of the RF power from the RF sources 348 and 352, the ESC 308, the antenna electrode 314, and the exhaust pump 320.

The gas distribution plate 306 is connected to the gas source 324, and serves as a gas inlet for gas from the gas source 324. The exhaust pump 320 serves as a gas outlet removing gas, which passes from the gas distribution plate 306 through the plasma region 340 to the exhaust pump 320. The exhaust pump 320 may help to control pressure.

A conductor etch tool, such as a Kiyo etch system made by Lam Research Corporation™ of Fremont, Calif., may be used in a preferred embodiment of the invention.

Figure 4:
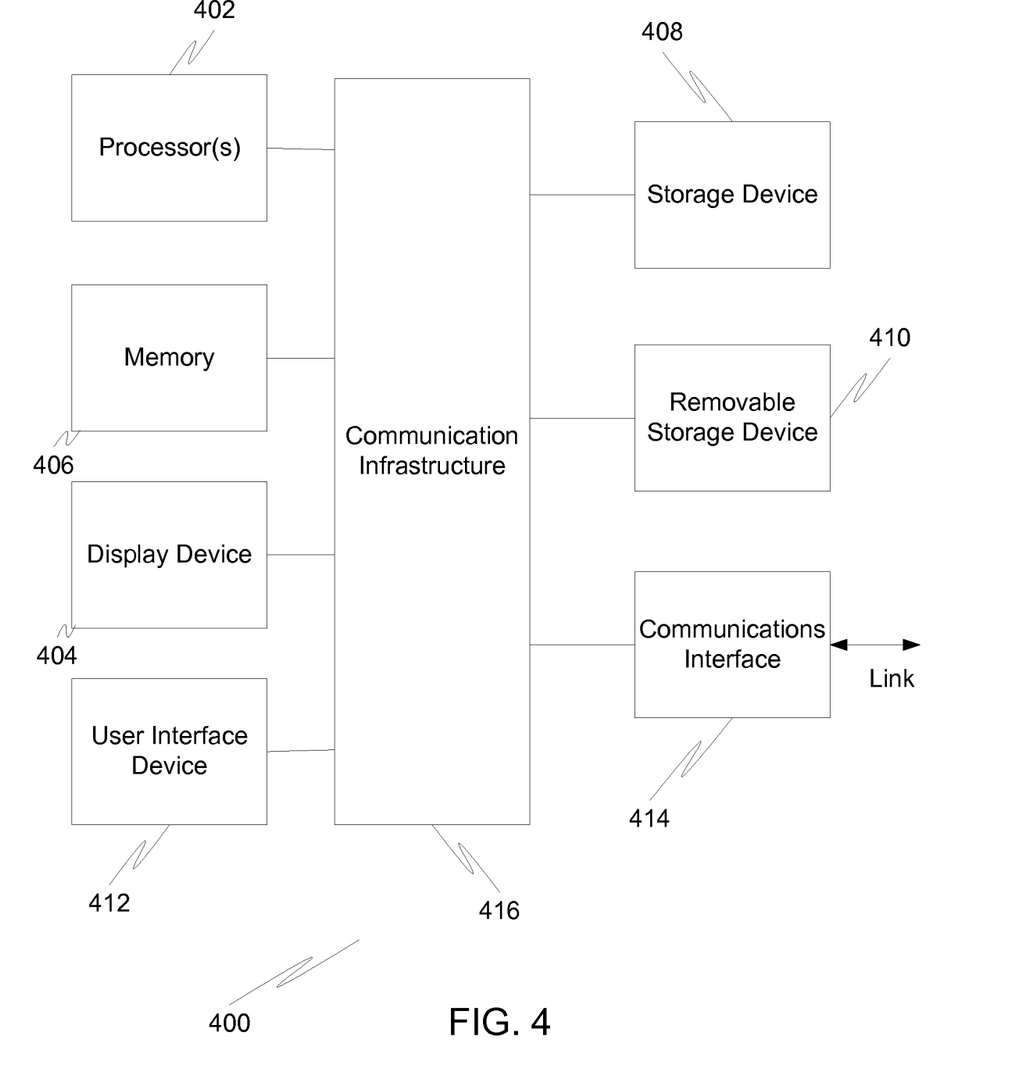
FIG. 4 illustrates a computer system, which is suitable for implementing a controller used in embodiments of the present invention.

FIG. 4 is a high level block diagram showing a computer system 400, which is suitable for implementing a controller 335 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 5:
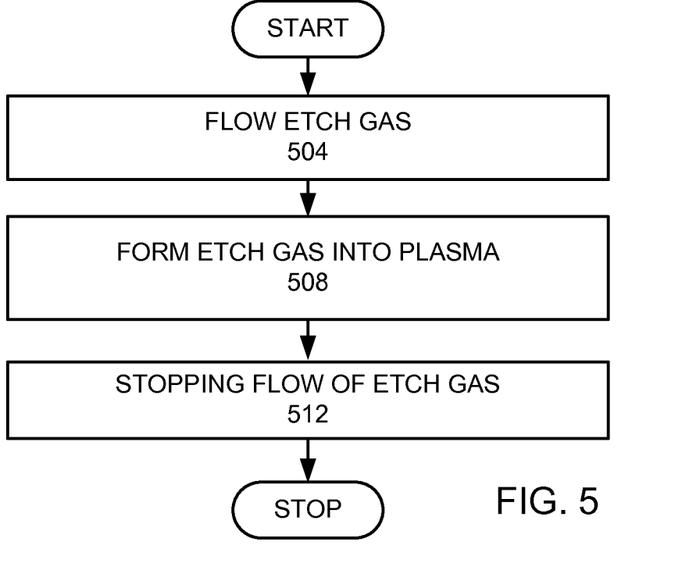
FIG. 5 is more detailed flow chart of an etch phase.

An etch is performed comprising a plurality of cycles, wherein each cycle comprises an etch phase step (step 108) and a clean phase step (step 112). FIG. 5 is a more detailed flow chart of the etch phase step (step 108). An etch gas is flowed from the gas source 324 into the process chamber 349 (step 504). Preferably, the etch gas comprises $PF_3$, CO and NO, or $COF_2$. More preferably, the etch gas is oxidizer free. Most preferably, the etch gas consist essentially of $PF_3$ or CO and NO. The etch gas is then formed into a plasma (step 508). After the plasma is used to etch the metal layer, the flow of the etch gas is stopped (step 512).

An example of a recipe for the etch phase provides a pressure of 5-30 mTorr. A flow of 50 to 200 sccm of $PF_3$ is flowed from the gas source into the process chamber (step 504). A bias RF at a frequency of 2 MHz is used to provide a 100-1000 volt bias to chuck the wafer to the ESC 308. An excitation RF with a power of 500 to 1,000 Watts is provided at a frequency of 13.56 MHz through the antenna electrode 314 to form a plasma from the etch gas (step 508). The process chamber temperature is maintained at a temperature between 20° to 120° C. The wafer is maintained at temperature between 0-120° C. After 2 to 10 seconds, the flow of the etch gas is stopped (step 512). In other embodiments, the bias RF may have a frequency of 400 kHz or 13.56 MHz.

Figure 2B:
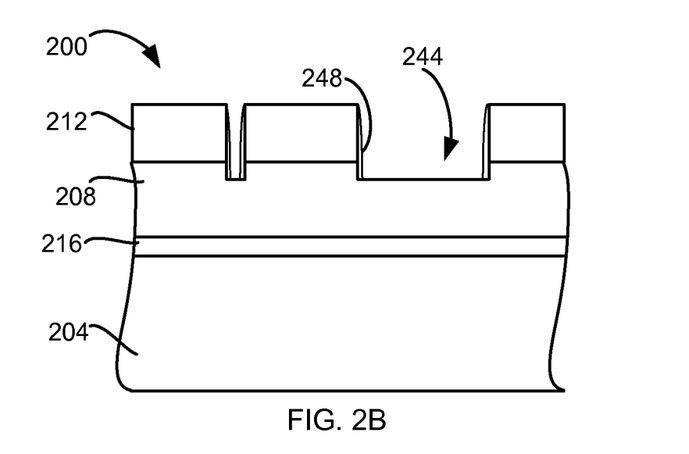

FIG. 2B is a cross sectional view of the stack 200 after the etch phase is completed in a cycle. Features 244 are partially etched into the metal layer 208. The etch gas causes carbon or phosphorous sidewall deposits 248 on the sidewalls and bottoms of the features 244. These deposits may become an etch stop or in other ways may compromise the etch process.

Figure 6:
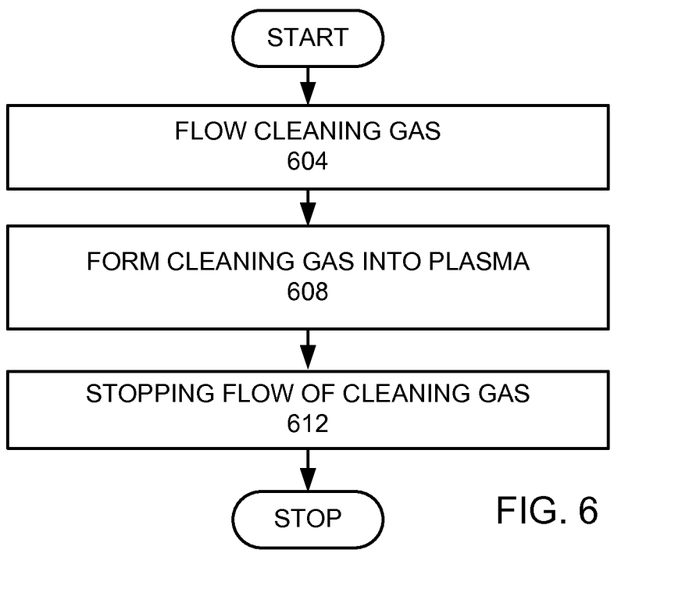
FIG. 6 is a more detailed flow chart of a cleaning phase.

FIG. 6 is a more detailed flow chart of the clean phase step (step 112). A cleaning gas is flowed from the gas source 324 into the process chamber 349 (step 604). Preferably, the cleaning gas comprises at least one of $H_2$, $O_2$, CO, $Cl_2$, $NH_3$, $NF_3$, or NO. Preferably, the cleaning gas consists essentially of one or more of $H_2$, $O_2$, CO, $Cl_2$, $NH_3$, $NF_3$, or NO. More preferably, the cleaning gas consists essentially of $H_2$. The cleaning gas is then formed into a plasma (step 608). After the plasma is used to clean the metal layer, the flow of the cleaning gas is stopped (step 612).

An example of a recipe for the clean phase provides a pressure of 5-100 mTorr. A flow of 100-500 sccm of $H_2$ is flowed from the gas source 324 into the process chamber 349 (step 604). A bias RF at a frequency of 2 MHz is used to provide a 100-400 volt bias to chuck the wafer to the ESC 308. An excitation RF with a power of 500 to 1,000 Watts is provided at a frequency of 13.56 MHz through the antenna electrode 314 to form a plasma from the cleaning gas (step 608). The process chamber temperature is maintained at a temperature between 20° to 120° C. After 2 to 10 seconds, the flow of the cleaning gas is stopped (step 612). In other embodiments, the bias RF may have a frequency of 400 kHz or 13.56 MHz.

Figure 2C:
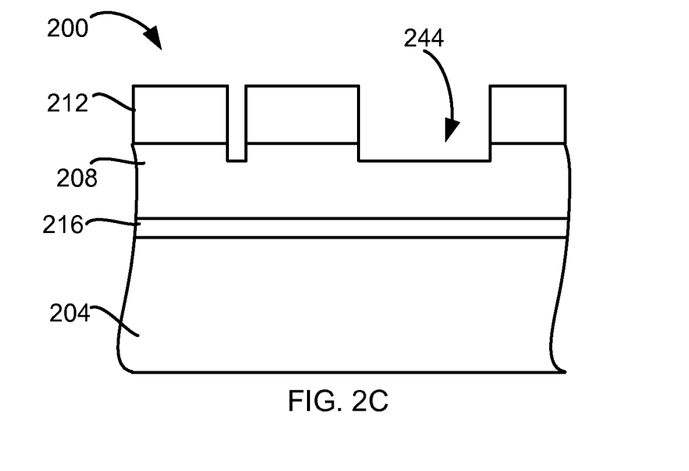

FIG. 2C is a cross sectional view of the stack 200 after the clean phase is completed in a cycle. The carbon or phosphorous sidewall deposits on the sidewalls and bottoms of the features 244 have been removed to allow for further etching.

Because many of the parameters between the etch phase and the clean phase are kept constant, cycling between the etch phase and clean phase may be performed rapidly. The cycle between the etch phase and clean phase are repeated until the etch reaches the target depth (step 116). Additional etches and processes may be performed on the metal layer or other layers. The metal layer is then removed from the chamber (step 120).

Activation Phase and Etch Phase

Figure 7:
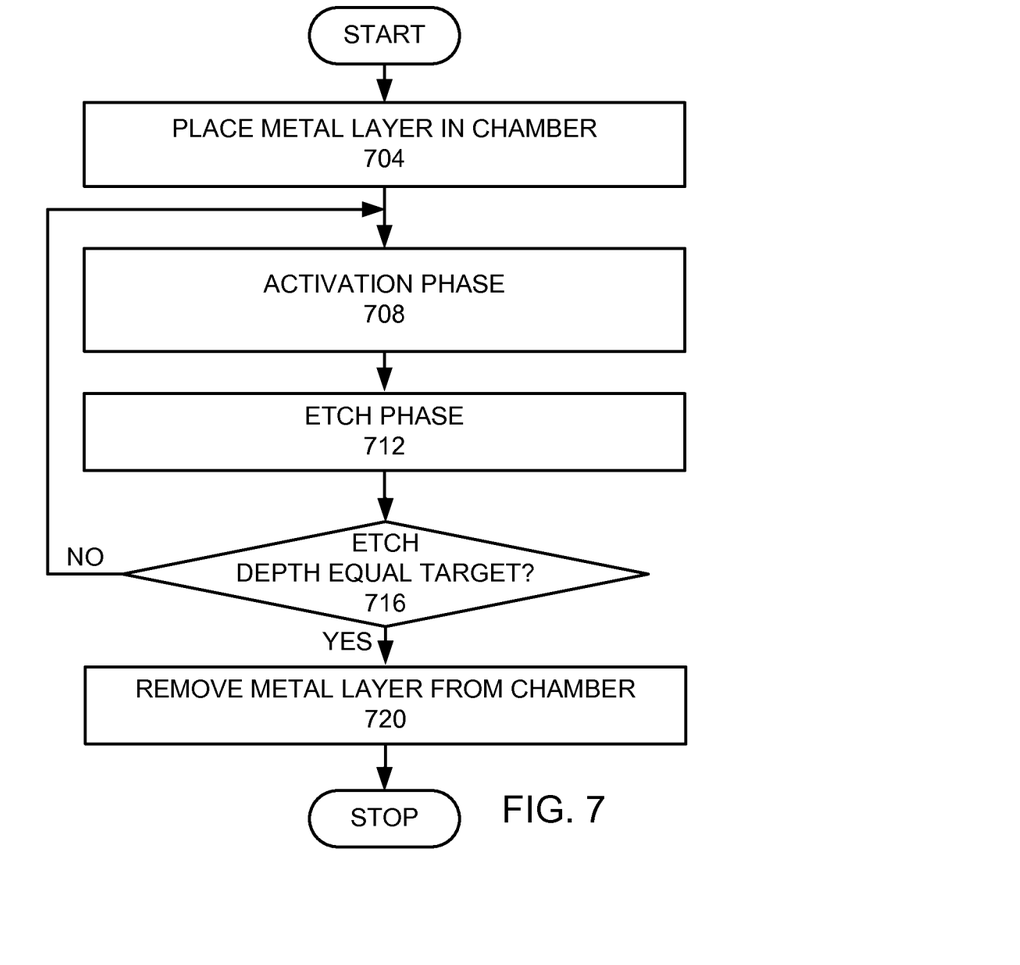
FIG. 7 is a high level flow chart of another embodiment of the invention.

To facilitate understanding, FIG. 7 is a high level flow chart of a process used in an embodiment of the invention that provides an activation phase and an etch phase. A substrate with a metal layer is placed in a chamber (step 704). An etch process is performed comprising a plurality of cycles, wherein each cycle comprises an activation phase (step 708) and an etch phase (step 712). A determination is made of whether the etch is complete or should continue, such as whether the etch depth is equal to a target etch depth (step 716). If the etch is not complete, then the process goes back to step 708. If the etch is complete, then the substrate and remaining metal layer are removed from the chamber (step 720).

EXAMPLES

Figure 8A:
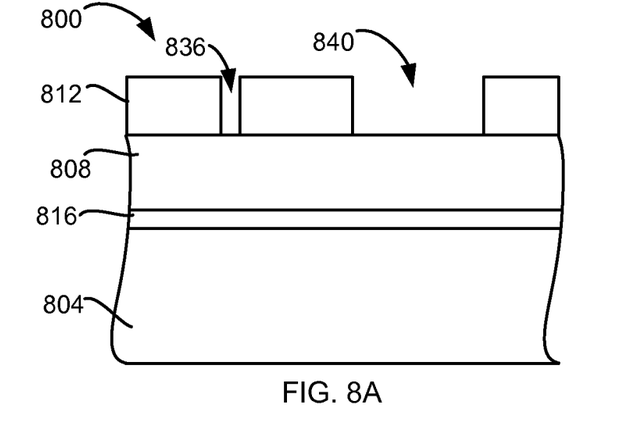
FIGS. 8A-C are schematic views of a stack processed according to an embodiment of the invention.

In an example of the invention, a substrate with a metal layer is placed in a plasma processing chamber (step 704), such as the etch reactor 300 shown in FIG. 3. FIG. 8A is a cross-sectional view of a stack 800 with a substrate 804 over which a metal layer 808 has been formed. A patterned thermal hardmask layer 812 is placed over the metal layer 808. In this example, an intermediate layer 816 is placed between the substrate 804 and the metal layer 808. One or more layers may be placed between the substrate 804 and the metal layer 808. In addition, one or more layers may be placed between the patterned thermal hardmask layer 812 and the metal layer 808. In this example, the patterned thermal hardmask layer 812 has features 836, 840 with different aspect ratios. A patterned photoresist mask may be placed above the patterned thermal hardmask layer 812. In this example, the substrate 804 is a silicon wafer, and the metal layer 808 is iron (Fe). Additional metal layers may be used to form magnetoresistive random-access memory (MRAM) or a resistive random-access memory (RRAM) device. The intermediate layer 816 may be one or more additional layers used to form MRAM or RRAM devices. The patterned thermal hardmask layer 812 may be a conventional hardmask material such as SiN, $SiO_2$, TiN, W, Ta, TaN or may be another material. In this embodiment the patterned thermal hardmask layer 812 is resistant to ashing or melting at temperatures at which a precursor metal complex would vaporize. Because of this, the patterned thermal hardmask layer 812 would not be formed from a photoresist material, which melts at a temperature below 300° C.

Figure 9:
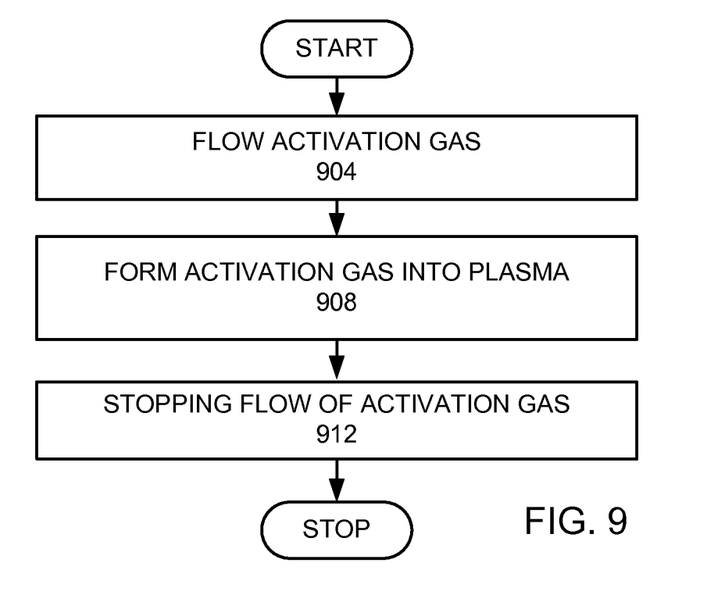
FIG. 9 is more detailed flow chart of an activation phase.

An etch is performed comprising a plurality of cycles, wherein each cycle comprises an activation phase step (step 708) and an etch phase step (step 712). FIG. 9 is a more detailed flow chart of the activation phase step (step 708). An activation gas is flowed from the gas source 324 into the process chamber 349 (step 904). Preferably, the activation gas comprises at least one of He, $H_2$, or Ar. More preferably, the activation gas consists essentially of at least one of He, $H_2$, or Ar. The activation gas is then formed into a plasma (step 908). After the plasma is used to activate the metal layer, the flow of the activation gas is stopped (step 912).

Without being bound by theory, it is believed that the activation step provides ion bombardment of the metal layer to create a rough intermixed layer a few monolayers deep, which will make it easier for the etch step to act on the surface.

An example of a recipe for the activation phase provides a pressure of 5-30 mTorr. A flow of 100-500 sccm of Ar or He is flowed from the gas source into the process chamber (step 904). A bias RF at a frequency of 2 MHz is used to provide a 100-400 volt bias to chuck the wafer to the ESC 308. An excitation RF with a power of 500 to 1,000 Watts is provided at a frequency of 13.56 MHz through the antenna electrode 314 to form a plasma from the etch gas (step 908). The process chamber temperature is maintained at a temperature between 20° to 120° C. After 2 to 10 seconds, the flow of the activation gas is stopped (step 912). In other embodiments, the bias RF may have a frequency of 400 kHz or 13.56 MHz.

Figure 8B:
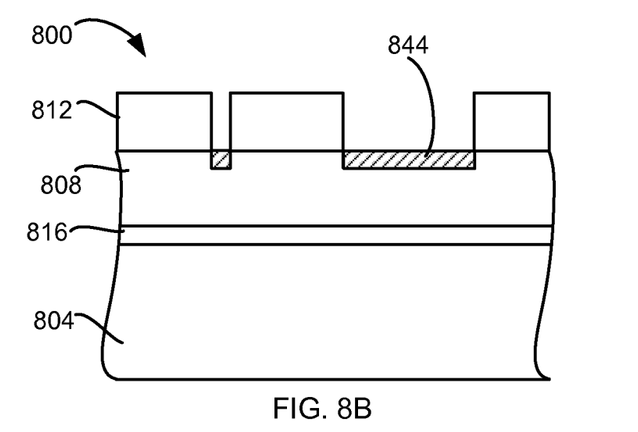

FIG. 8B is a cross sectional view of the stack 800 after the etch phase is completed in a cycle. Exposed portions of the metal layer 808 are activated becoming activated regions 844 of the metal layer 808.

Figure 10:
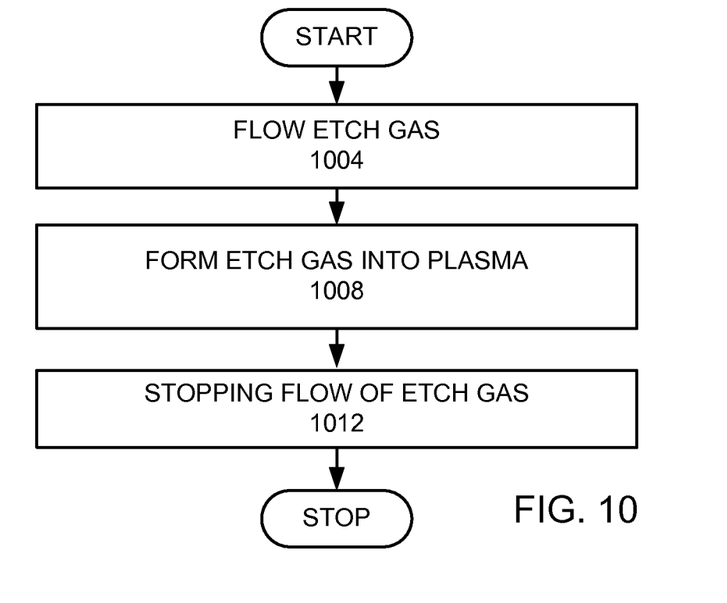
FIG. 10 is a more detailed flow chart of an etch phase.

FIG. 10 is a more detailed flow chart of the etch phase step (step 712). An etch gas is flowed from the gas source 324 into the process chamber 349 (step 1004). Preferably, the etch gas comprises $PF_3$, CO and NO, or $COF_2$. More preferably, the etch gas is oxidizer free. Most preferably, the etch gas consist essentially of $PF_3$ or CO and NO. The etch gas is then formed into a plasma (step 1008). After the plasma is used to etch the metal layer, the flow of the etch gas is stopped (step 1012).

An example of a recipe for the etch phase provides a pressure of 5-30 mTorr. A flow of 50 to 200 sccm of $PF_3$ is flowed from the gas source into the process chamber (step 1004). A bias RF at a frequency of 2 MHz is used to provide a 100-400 volt bias to chuck the wafer to the ESC 308. An excitation RF with a power of 500 to 1,000 Watts is provided at a frequency of 13.56 MHz through the antenna electrode 314 to form a plasma from the etch gas (step 1008). The process chamber temperature is maintained at a temperature between 20° to 120° C. After 2 to 10 seconds, the flow of the etch gas is stopped (step 1012). In other embodiments, the bias RF may have a frequency of 400 kHz or 13.56 MHz.

If the etch gas is $PF_3$ the resulting volatile compounds may be $Pd(PF_3)_4$, $Pt(PF_3)_4$, or other similar compounds for Fe, Co, Ni, Ir, or other metals. In such embodiments, dissociation of $PF_3$ is minimized. For embodiments with a CO and NO etch gas, volatile byproducts may be $Co(CO)_3NO$ or similar volatile compounds. The addition of chlorine may further enhance the etching process by providing volatile compounds such as $Ni(PF_2Cl))_2$.

Figure 8C:
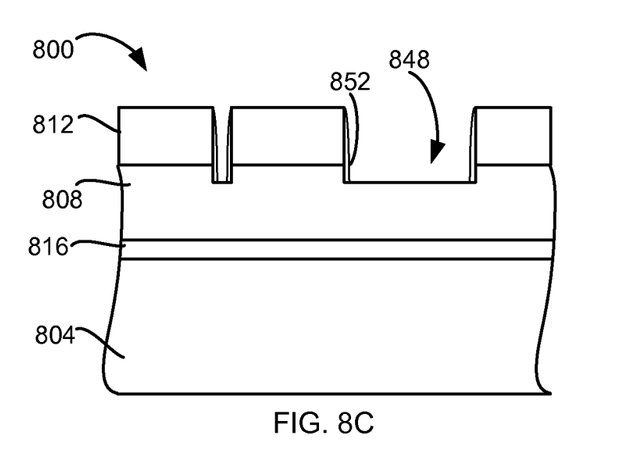

FIG. 8C is a cross sectional view of the stack 800 after the etch phase is completed in a cycle. Features 848 are partially etched into the metal layer 808 removing the activated regions. The etch gas causes carbon or phosphorous sidewall deposits 852 on the sidewalls and bottoms of the features 848. The clean step is targeted towards cleaning this deposition.

Because many of the parameters between the etch phase and the clean phase are kept constant, cycling between the etch phase and clean phase may be performed rapidly. The cycle between the etch phase and clean phase is repeated until the etch reaches the target depth (step 716). Additional etches and processes may be performed on the metal layer or other layers. The metal layer is then removed from the chamber (step 720).

Figure 11:
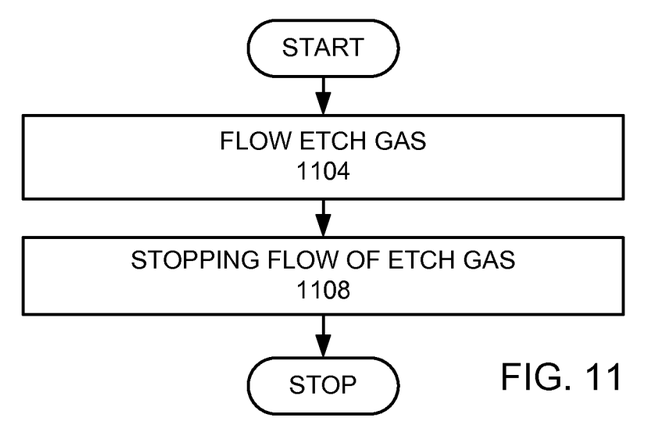
FIG. 11 is a more detailed flow chart of an etch phase in another embodiment of the invention.

FIG. 11 is a more detailed flow chart for an etch phase (step 712) used in another embodiment of the invention that uses the process shown in FIG. 7, but with a different etch phase. In this embodiment, an etch gas is flowed into the process chamber (step 1104). The etch gas is then stopped (step 1108). In this embodiment, the etch gas is not transformed into a plasma. Preferably, the etch gas comprises $PF_3$ or CO and NO. More preferably, the etch gas is oxidizer free. Most preferably the etch gas consists essentially of at least one of $PF_3$ or CO and NO.

An example a recipe for the etch phase provides a pressure of 5-30 mTorr. A flow of 50 to 200 sccm of $PF_3$ is flowed from the gas source into the process chamber. A bias RF at a frequency of 2 MHz is used to provide a 100-400 volt bias to chuck the wafer to the ESC 308. An excitation RF with a power of 500 to 1,000 Watts is provided at a frequency of 13.56 MHz through the antenna electrode 314 to form a plasma from the etch gas. The process chamber temperature is maintained at a temperature between 20° to 120° C. After 2 to 10 seconds, the flow of the etch gas is stopped. In other embodiments, the bias RF may have a frequency of 400 kHz or 13.56 MHz.

These embodiments provide improved methods for etching metal layers without sputtering the metals. Various embodiments provide atomic layer etch control for improved etch control. For MRAM devices that have a plurality of different thin metal layers, embodiments of the invention provide more controlled etches to selectively etch different metal layers with respect to the mask. Embodiments of the invention may also selectively etch one metal layer with respect to another metal layer. Embodiments provide improved feature profile angle control and sidewall polymer control. Embodiments also reduce the amount of metallic byproducts deposited on chamber walls and thus help in resolving many productivity issues like particles and RF power coupling. Embodiments of the invention provide a plurality of cycles that is at least 3 cycles. Other embodiments of the invention provide a plurality of cycles that is at least 10 cycles.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching a metal layer, comprising plurality of cycles, wherein each cycle comprises an etch phase, comprising:
   flowing an etch gas comprising $PF_3$, CO and NO, or $COF_2$ into a process chamber;
   forming the etch gas into a plasma; and
   stopping the flow of the etch gas.

2. The method, as recited in claim 1, wherein each cycle further comprises an activation phase, comprising:
   flowing an activation gas comprising He, $H_2$, or Ar into the process chamber;
   forming the activation gas into plasma; and
   stopping the flow of the activation gas.

3. The method, as recited in claim 1, wherein each cycle further comprises a clean phase comprising:
   flowing cleaning gas comprising at least one of $H_2$, $O_2$, CO, $Cl_2$, $NH_3$, $NF_3$, or NO into the process chamber;
   forming the cleaning gas into a plasma; and
   stopping the flow of the cleaning gas.

4. The method, as recited in claim 3, wherein the etch gas consists essentially of CO and NO.

5. The method, as recited in claim 3, wherein the etch gas consists essentially of $PF_3$.

6. The method, as recited in claim 5, wherein a period from the flowing the etch gas to stopping the flow of the etch gas is between 2 to 10 seconds.

7. The method, as recited in claim 6, wherein a period from flowing the cleaning gas to stopping the flow of the cleaning gas is between 2 to 10 seconds.

8. The method, as recited in claim 7, wherein the plurality of cycles is at least 10 cycles.

9. The method, as recited in claim 3, wherein a period from flowing the cleaning gas to stopping the flow of the cleaning gas is between 2 to 10 seconds.

10. The method, as recited in claim 1, wherein the etch gas consists essentially of CO and NO.

11. The method, as recited in claim 1, wherein the etch gas consists essentially of $PF_3$.

12. The method, as recited in claim 1, wherein a period from the flowing the etch gas to stopping the flow of the etch gas is between 2 to 10 seconds.

13. The method, as recited in claim 1, wherein the plurality of cycles is at least 10 cycles.

14. A method for etching a metal layer, comprising plurality of cycles, wherein each cycle comprises:
   an activation phase, comprising:
      flowing an activation gas comprising He, $H_2$, or Ar into a process chamber;
      forming the activation gas into a plasma; and
      stopping the flow of the activation gas into the process chamber; and
   an etch phase, comprising:
      flowing an etch gas comprising $PF_3$ or CO and NO into the process chamber, wherein the etch gas is not transformed into a plasma; and
      stopping the flow of the etch gas into the process chamber.

15. The method, as recited in claim 14, wherein the etch gas is oxidizer free.

16. The method, as recited in claim 15, wherein the etch gas consists essentially of $PF_3$ or CO and NO.

17. The method, as recited in claim 14, wherein a period from the flowing the etch gas to stopping the flow of the etch gas is between 2 to 10 seconds.

18. The method, as recited in claim 14, wherein the plurality of cycles is at least 10 cycles.

* * * * *